(12) United States Patent
DeLuca et al.

(10) Patent No.: US 7,018,556 B2
(45) Date of Patent: Mar. 28, 2006

(54) METHOD TO ETCH CHROME DEPOSITED ON CALCIUM FLUORIDE OBJECT

(75) Inventors: Nicholas A. DeLuca, Stratford, CT (US); Ronald P. Albright, Norwalk, CT (US)

(73) Assignee: ASML Holding N.V., Veldhoven (NL)

( * ) Notice: Subject to any disclaimer, the term of this patent is extended or adjusted under 35 U.S.C. 154(b) by 153 days.

(21) Appl. No.: 10/682,826

(22) Filed: Oct. 10, 2003

(65) Prior Publication Data

US 2005/0077267 A1 Apr. 14, 2005

(51) Int. Cl.
*C23F 1/00* (2006.01)

(52) U.S. Cl. .................. 216/100; 216/96; 252/79.1; 252/79.5; 430/5

(58) Field of Classification Search .............. 216/96, 216/100; 252/79.1, 79.5; 430/5
See application file for complete search history.

(56) References Cited

U.S. PATENT DOCUMENTS

| 5,246,801 | A  | * | 9/1993  | Pierrat ........................... 430/5 |
| 6,645,856 | B1 | * | 11/2003 | Tanaka et al. .............. 438/671 |
| 6,825,898 | B1 | * | 11/2004 | Kobayashi et al. ........... 349/95 |
| 2004/0137336 | A1 | * | 7/2004 | Cummings ..................... 430/5 |

\* cited by examiner

*Primary Examiner*—Shamim Ahmed
(74) *Attorney, Agent, or Firm*—Sterne, Kessler, Goldstein & Fox P.L.L.C.

(57) ABSTRACT

A method for maintaining a micro-roughness finish after etching chrome from a surface of a calcium fluoride ($CaF_2$) object. Etching the chrome a first amount in a first chrome etchant. Etching the chrome a second amount beyond the first predetermined amount in second chrome etchant, such that the CaF2 object maintains a low micro-roughness.

10 Claims, 1 Drawing Sheet

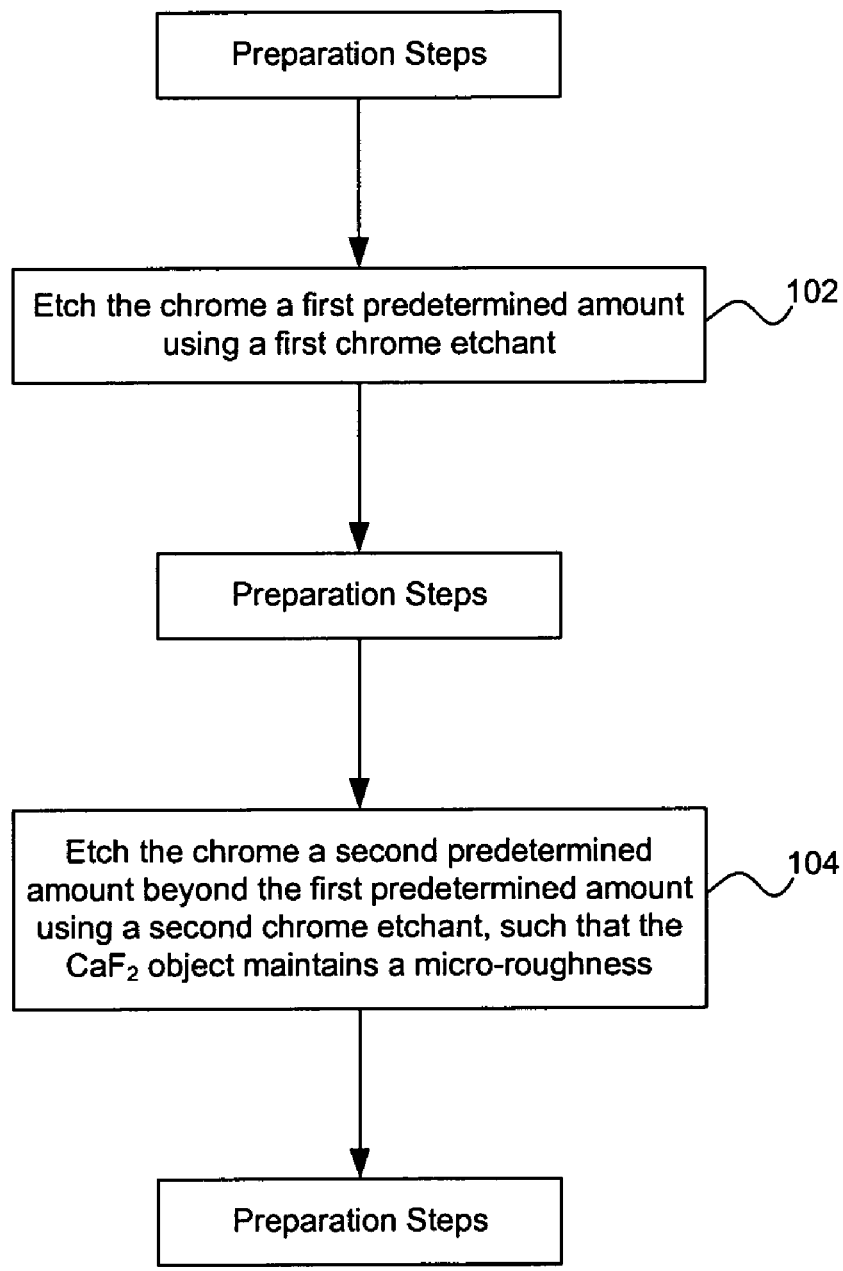

METHOD TO ETCH CHROME DEPOSITED ON CALCIUM FLUORIDE OBJECT

BACKGROUND OF THE INVENTION

1. Field of the Invention

The present invention is related to etching of chrome from calcium fluoride ($CaF_2$) objects.

2. Background Art

Typically, chrome is deposited and etched on a surface of $CaF_2$ material to form a pattern on the surface of the $CaF_2$ material. For example, one manufacturer of $CaF_2$ material is SCHOTT Lithotec AG of Germany. Etching chrome from a high quality, low micro-roughness finish $CaF_2$ material can damage the surface beyond a threshold amount. This is because the $CaF_2$ material cannot be reworked or repolished because such subsequent processing would further damage or destroy the patterned surface. Thus, a threshold amount of damage is established that allows light to transmit through the $CaF_2$ material with only a predetermined amount of absorption and/or scattering of the light.

In one example, the $CaF_2$ material can be used as an optical element in 157 nanometer (nm) lithography tools. However, if a level of damage is severe enough (e.g., greater than a few Angstroms deep) the optical element cannot be used because it most likely will not properly transmit light at this wavelength (e.g., too much light will be absorbed and/or scattered).

Therefore, what is needed is a method of etching chrome from a surface of $CaF_2$ material, while maintaining a micro-finish on surface of the $CaF_2$ material.

BRIEF SUMMARY OF THE INVENTION

Embodiments of the present invention provide a method of removing chrome from the surface of a calcium fluoride ($CaF_2$) object by etching the chrome a first amount in a first chrome etchant, and etching the chrome a second amount beyond the first amount in second selective chrome etchant, such that the $CaF_2$ object maintains a micro-roughness.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawing, which is incorporated herein and forms a part of the specification, illustrates the present invention and, together with the description, further serves to explain the principles of the invention and to enable a person skilled in the pertinent art to make and use the invention.

This FIGURE shows a flowchart depicting a method according to embodiments of the present invention.

DETAILED DESCRIPTION OF THE INVENTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Embodiments of the present invention provide a two-stage method of etching chrome from a surface of a $CaF_2$ material, while maintaining a micro-finish quality of the surface. During a first stage, an etch is performed using first etchant. During a second stage, a selective etch is performed using a second etchant.

The FIGURE shows a flowchart depicting a method 100 according to embodiments of the present invention. Optionally, preparation steps can be performed before method 100 begins.

In step 102, chrome is etched a first amount of time corresponding to etching a first amount of the chrome (and possibly other materials on the chrome, such as chrome oxide) using a first chrome etchant. The first chrome etchant can be a chrome etchant containing ceric ammonium nitrate $((NH_4)_2 Ce(NO_3)_6)$ and an acid can be used. An example of an acid can be nitric acid ($HNO_3$) or acetic acid ($C_2H_4O_2$).

An appropriate etch time is determined from a thickness of the chrome, as would be apparent to a skilled artisan. All etch times are contemplated within the scope of the present invention.

In one example, the first amount of time is a time period necessary to etch some portion (e.g., about half) of a total thickness of the chrome. Other predetermined etching amounts are also contemplated within the scope of the present invention.

It is to be appreciated that there can be other preparation steps after step 102, for example, a rinsing step and a drying step.

In step 104, the chrome is etched a second amount of time corresponding to etching a second amount of the chrome beyond the first amount of the chrome using a second chrome etchant, which can be a selective chrome etchant. The second chrome etchant can have a relatively slow etch rate, possibly a slower etch rate than the first chrome etchant. The second chrome etchant can be an alkaline chrome etchant. For example, the second chrome etchant can include potassium ferricyanide ($K_3Fe(CN)_6$). The second chrome etchant can also include sodium hydroxide (NaOH) and water ($H_2O$).

An appropriate etch time is determined from a thickness of the chrome, as would be apparent to a skilled artisan. All etch times are contemplated within the scope of the present invention.

In one example, the second amount of time is an amount of time necessary to etch some portion, perhaps a remaining portion, of the chrome. Other etching amounts are also contemplated within the scope of the present invention, which can partially be based on the first etched amount.

It is to be appreciated that there can be other preparation steps after step 104, for example, a rinsing step and a drying step.

Thus, when the chrome is etched, the surface can be configured to function as a mask, a reticle, a diffraction grating, a field stop, a beamsplitter, or any other patterned optical element. For example, the $CaF_2$ object can be a patterned optical element in a telescope, infrared (IR) optics, a lithography tool, such as a 157 nm lithography tool, or in any other wavelength lithography tool or optical system.

Using the two step chrome etching method 100 above results in the $CaF_2$ etched surface maintaining its micro-roughness finish. For example, a low micro-roughness finish equal to or less than a few microns can be achieved.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method comprising:
   etching chrome a first amount using a first chrome etchant; and
   etching the chrome a second amount beyond the first amount using a selective second chrome etchant that is a different etchant than the first chrome etchant.

2. The method of claim 1, further comprising:
   using potassium ferricyanide ($K_3Fe(CN)_6$) for at least part of the second chrome etchant.

3. The method of claim 1, further comprising:
   using an alkaline etchant for at least part of the second chrome etchant.

4. The method of claim 1, wherein the etchings produce the low micro-roughness is at or below about few Angstroms.

5. The method of claim 1, further comprising using at least one of a patterned optical element, a reticle, a mask, a diffraction grating, a field stop, and a beam splitter.

6. The method of claim 1, further comprising using an optical element configured to be used in a 157 nm lithography tool.

7. The method of claim 1, further comprising establishing substantially an entire thickness of the chrome as a combination of the first and second amounts.

8. The method of claim 1, further comprising using the first chrome etchant to etch material on the chrome.

9. The method of claim 8, further comprising etching a chrome oxide as the material on the chrome.

10. The method of claim 1, wherein a $CaF_2$ object maintains a low micro-roughness after the etching steps.

* * * * *

UNITED STATES PATENT AND TRADEMARK OFFICE
CERTIFICATE OF CORRECTION

| | | |
|---|---|---|
| PATENT NO. | : 7,018,556 B2 | Page 1 of 1 |
| APPLICATION NO. | : 10/682826 | |
| DATED | : March 28, 2006 | |
| INVENTOR(S) | : DeLuca et al. | |

It is certified that error appears in the above-identified patent and that said Letters Patent is hereby corrected as shown below:

In column 4, line 5, delete "is" and replace "about few" with --about a few--.

Signed and Sealed this

Twenty-second Day of August, 2006

JON W. DUDAS
*Director of the United States Patent and Trademark Office*